United States Patent [19]
Liaw et al.

[11] Patent Number: 5,891,769
[45] Date of Patent: Apr. 6, 1999

[54] METHOD FOR FORMING A SEMICONDUCTOR DEVICE HAVING A HETEROEPITAXIAL LAYER

[75] Inventors: Hang Ming Liaw, Scottsdale; Curtis Lee Burt, Glendale; Stella Q. Hong, Gilbert, all of Ariz.; Clifford P. Stein, San Diego, Calif.

[73] Assignee: Motorola, Inc., Schaumburg, Ill.

[21] Appl. No.: 46,559

[22] Filed: Feb. 27, 1998

Related U.S. Application Data

[63] Continuation-in-part of Ser. No. 834,961, Apr. 7, 1997, abandoned.

[51] Int. Cl.⁶ .................................. H01L 21/338
[52] U.S. Cl. .................... 438/167; 438/933; 438/938
[58] Field of Search ................. 438/933, 938, 438/167

[56] References Cited

U.S. PATENT DOCUMENTS

| | | | |
|---|---|---|---|
| Re. 33,693 | 9/1991 | Bean et al. | 357/30 |
| 4,861,393 | 8/1989 | Bean et al. | 148/33.4 |
| 4,994,866 | 2/1991 | Awano | 357/16 |
| 5,019,882 | 5/1991 | Solomon et al. | 357/23.8 |
| 5,155,571 | 10/1992 | Wang et al. | 357/42 |
| 5,442,205 | 8/1995 | Brasen et al. | 257/191 |
| 5,461,243 | 10/1995 | Ek et al. | |
| 5,683,934 | 11/1997 | Candelaria | 437/134 |
| 5,705,421 | 1/1998 | Matsushita et al. | 437/62 |

OTHER PUBLICATIONS

D. M. Follstaedt, Appl. Phys. Lett., "Cavity–dislocation interactions in Si–Ge and implications for heterostructural relaxation", vol. 69, No. 14, 30 Sep. 1996, pp. 2059–2061.

G.L. Harris et al., "Low–Pressure Growth of Single–Crystal Silicon Carbide", Materials Letters, vol. 4, No. 2, Feb. 1986, pp. 77–80.

S. Nishino, "Chemical Vapour Deposition of SiC", Properties of SiC' EMIS Data Views Series an Inspec Publication, Jun. 1995, pp. 204–206.

B.C. Johnson et al., "Characterization and Growth of SiC Epilayers on Si Substrates", Superlattices and Microstructures, vol. 2, No. 3, 1986, pp. 223–231.

S. Nishino et al., "Epitaxial Growth and Electric Characteristics of Cubic SiC on Silicon", Journal of Applied Physics, vol. 61, No. 10, May 15, 1987, pp. 4889–4893.

*Primary Examiner*—Brian Dutton
*Attorney, Agent, or Firm*—Kevin B. Jackson

[57] ABSTRACT

A method for forming a relaxed semiconductor layer (12) includes forming a strained semiconductor layer on a substrate (11). The strained semiconductor layer has a different lattice constant than the substrate (11). Without exposing the strained semiconductor layer to an oxidizing ambient, the strained semiconductor layer is relaxed using thermal stress.

38 Claims, 2 Drawing Sheets

METHOD FOR FORMING A SEMICONDUCTOR DEVICE HAVING A HETEROEPITAXIAL LAYER

This application is a continuation-in-part of U.S. application Ser. No. 08/834,961, filed on Apr. 7, 1997, now abandoned, which is hereby incorporated by reference, and priority thereto for common subject matter is hereby claimed.

BACKGROUND OF THE INVENTION

This invention relates, in general, to semiconductor processing and more particularly, to methods for forming strained heterojunction semiconductor devices.

Strained semiconductor heterostructures are useful for a wide variety of device applications where a narrowed bandgap can improve device performance. For example, in heterojunction metal oxide semiconductor field effect transistor (MOSFET) devices, a strained channel region enhances carrier mobility within the channel. In strained silicon channel regions, the strained silicon layer typically is formed on a substrate of greater lattice parameters than that of silicon. A relaxed silicon-germanium substrate is a suitable material because of its compatibility with silicon processing.

One reported approach to forming a strained silicon channel layer involves growing a silicon layer on an as-grown relaxed or unstrained SiGe layer. The relaxed SiGe layer is formed by first growing a graded $Si_{1-x}Ge_x$ layer on a silicon substrate where x increases from 0% to 30% over a thickness of about 1.5 microns. Next, a 1.0 micron layer of $Si_{0.7}Ge_{0.3}$ is grown over the graded layer followed a thin $Si_{1-x}Ge_x$ layer where x decreases from 30% to 0% over a thickness of about 0.03 microns. This approach has several disadvantages including a high epitaxial film cost because it takes approximately 6–8 hours to grow the different layers. Additionally, this approach results in a high concentration of threading dislocations because of the thick epitaxial layers.

Accordingly, methods are needed for forming heterojunction devices having strained layers formed on relaxed layers with low levels of defects. It would be of further advantage for these methods to be cost effective.

DETAILED DESCRIPTION OF THE DRAWINGS

In general, the present invention relates to methods for forming a relaxed semiconductor layer over which a strained semiconductor layer is later formed to provide enhanced device characteristics. In particular, a first semiconductor layer having a first lattice constant is formed over a substrate comprising a material having a second lattice constant, which is different than the first lattice constant. This difference in lattice constant creates a strained semiconductor layer. The first semiconductor layer is then relaxed by thermal stress without exposing the substrate to an oxidizing ambient. An oxidizing ambient is one where enough oxygen is present to form a native oxide on the first semiconductor layer.

In addition to the as-grown relaxed SiGe process set forth in the Background section above, other reported approaches for forming relaxed SiGe layers include growing a strained SiGe layer and relaxing the strained layer using external high temperature thermal treatments. The thermal treatments are carried out using a furnace or rapid thermal anneal (RTA) after the strained layer is formed. Disadvantages of this approach include added process steps, incomplete relaxation, and high densities of threading dislocations.

To overcome the dislocation problem, one reported approach uses a thin buried oxide below the strained SiGe layer. During annealing, it is believed that relaxation occurs through a slippage mechanism. One problem with this approach is that in order for slippage to occur, high temperature (e.g., on the order of 1150° C. to 1200° C.) annealing is required, which often creates crystal imperfections in the SiGe due to inter-diffusion of Ge.

Figure 1:
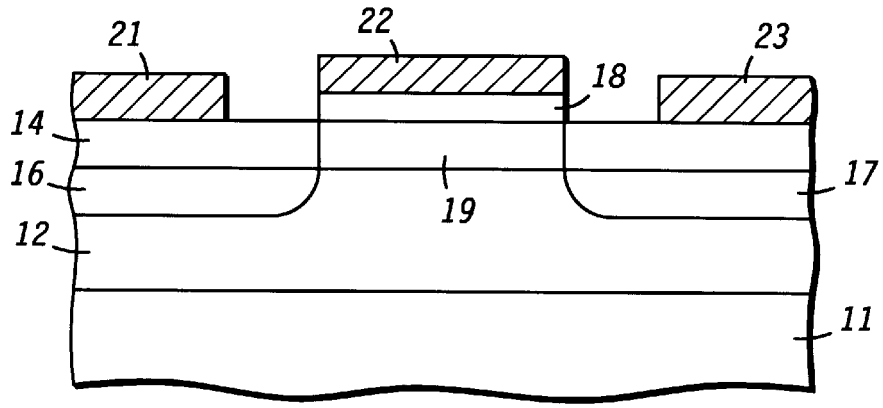
FIG. 1 illustrates an enlarged cross-section view of a strain-enhanced mobility field effect transistor (SEMFET) device fabricated according to the present invention.

Other approaches include implanting helium or hydrogen into a strained SiGe layer and the use of low melting point glasses below the strained layer. Disadvantages of the implantation approach include defect formation (e.g., microcavities and dislocations) and high temperature annealing, which causes an inter-diffusion of Ge. In the low melting point glass approach, boron is implanted at high doses into the $SiO_2$ layer to reduce the melting point. The high boron concentration creates dopant defects and contamination, which in turn degrades device performance Turning now to the present invention, FIG. 1 illustrates an enlarged simplified cross-sectional view of a semiconductor device formed by a method according to the present invention. Device 10 represents a strained-enhanced mobility FET (SEMFET) device (i.e., a heterojunction semiconductor device) and includes a semiconductor substrate 11, a relaxed semiconductor layer 12 formed over substrate 11, and a strained semiconductor layer 14 formed over relaxed layer 12. Substrate 11 and strained semiconductor layer 14 comprise materials having different lattice constants than relaxed semiconductor layer 12. In a preferred embodiment, substrate 11 comprises silicon, relaxed layer 12 comprises $Si_{1-x}Ge_x$, and strained layer 14 comprises silicon.

Device 10 further includes a source region 16, a drain region 17, a gate dielectric layer 18 formed over strained layer 14, a source electrode 21, a gate electrode 22, a drain electrode 23. Gate dielectric layer 18 and gate electrode 22 together form a gate control structure. These elements of device 10 are formed using conventional techniques including ion implantation, photolithographic, oxidation, and thin film deposition techniques.

That portion of strained layer 14 between source region 16 and drain region 17 forms a strained channel region 19. Due to the difference in lattice parameters between relaxed layer 12 and strained layer 14, carrier mobility is enhanced in strained channel region 19 because, among other things, the carrier effective mass is reduced resulting from the split in conduction band energy.

Figure 2:
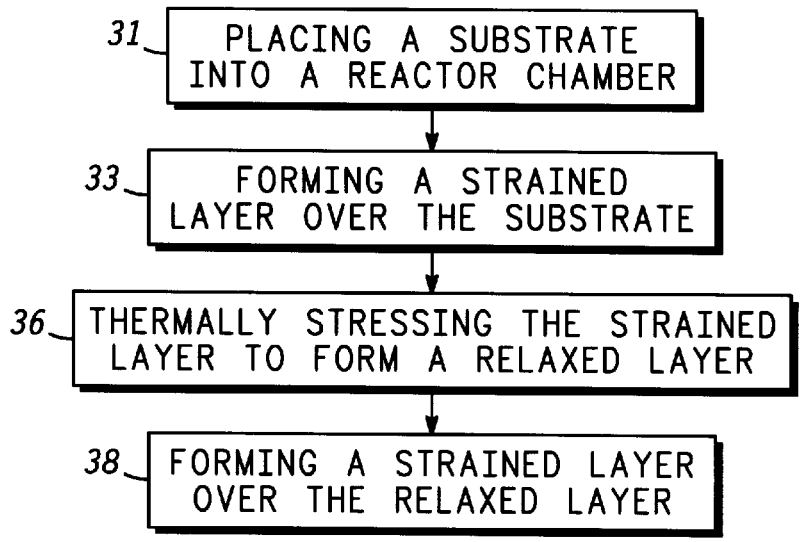
FIG. 2 illustrates a flow chart of a process according to the present invention.

FIG. 2 illustrates a flow diagram representing a preferred process flow according to the present invention for forming relaxed layer 12 and strained layer 14 illustrated in FIG. 1.

For purposes of illustration only, a Si/Si$_{1-x}$Ge$_x$ embodiment is shown. As those skilled in art can appreciate, other material combinations may be used.

Block 31 represents the step of placing substrate 11 into a reactor chamber. Suitable reactors include the Epsilon family of epitaxial reactors available from Advanced Semiconductor Materials, Inc., of Tempe, Ariz. Once substrate 11 is placed within the reactor chamber, substrate 11 is prebaked or etched using conventional techniques and the appropriate growth conditions are established (e.g., pressure and temperature). Alternatively, substrate 11 is cleaned and its native oxide removed prior to placement into the reactor chamber.

For a reduced pressure process, the pressure in the reactor chamber preferably is lowered to a range from about 20 torr to about 100 torr and the growth temperature preferably is in a range from about 500° C. to about 800° C. A strained layer of Si$_{1-x}$Ge$_x$ is then grown on substrate 11 as represented by block 33. A silicon source gas such as dichlorosilane and germane are suitable for forming the strained layer. Typically, x is in a range from about 10 to about 50 percent with a preferred range from about 25 to about 35 percent. It is not necessary for the strained Si$_{1-x}$Ge$_x$ layer to be graded. In a typical n-channel SEMFET device, the strained layer Si$_{1-x}$Ge$_x$ is undoped. Optionally, a dopant such as boron or carbon is incorporated to adjust the degree of film stress.

According to the method of the present invention, the thickness of the strained layer is kept below its critical thickness. The critical thickness is that thickness where the crystal lattice has not yet relaxed and misfit dislocations have not been generated. In a preferred embodiment having a Si$_{1-x}$Ge$_x$ strained layer with x equal to 10% to 50%, the strained layer has a final thickness from about 3000 angstroms to about 400 angstroms respectively. That is, as the concentration of Ge increases, the critical thickness of the strained layer decreases and vice versa.

As is evident from these target thickness values, the method according to the present invention provides for a much thinner SiGe layer compared to the as-grown relaxed prior art structure where 25,000 angstrom SiGe films are typical. This provides substantial processing cost savings and greatly reduces processing time. Also, because the strained layer can be non-graded, the SiGe process is simplified.

Next, as represented by block 36, relaxation is induced in the strained layer by thermal stress without exposing substrate 11 and the strained layer to an oxidizing ambient. In other words, relaxation is induced in-situ wherein the exposed surface of the strained layer is substantially absent a native oxide film. It was found that by avoiding exposure to an oxidizing ambient according to the present invention, native oxide formation on the strained layer is avoided, which provides more complete relaxation and avoids the formation of threading dislocations.

Preferably, after the strained layer is grown, the reactor heating means are turned off, and substrate 11 is allowed to cool in the reactor chamber to a temperature below the growth temperature to create the thermal stress, which in turn provides relaxation. Preferably, vacuum is maintained and/or hydrogen gas (or an inert gas) flows within the reactor chamber to provide a cooling rate on the order of about 65° C. per minute.

In a preferred embodiment, substrate 11 is cooled to a temperature on the order of 100° C. or less. Substrate 11 typically is kept at the temperature on the order of 100° C. or less for about 0.5 minutes to about 1.0 minute before either removing substrate 11 from the reactor chamber or before establishing the appropriate growth conditions for forming strained layer 14. In an alternative embodiment, after substrate 11 has cooled, the reactor heating means are turned back on and substrate 11 is heated to a temperature above the growth temperature at which the strained SiGe layer was formed. For example, when the growth temperature for the strained layer is on the order of 700° C., substrate 11 is heated to a temperature in a range from about 750° C. to about 800° C.

It is believed that during this process (i.e., thermal stress), the difference in thermal expansion coefficients between substrate 11 and the strained layer generates origins of dislocations on the surface of the strained layer. These dislocations propagate as a loop and migrate to the interface between substrate 11 and the strained layer to become misfit dislocations. With the location of misfit dislocations at the interface, they tend not to propagate upward and thus any subsequently formed layers contain few dislocations.

It was found that the generation and propagation of the dislocations repeat themselves as long as the strained layer is under thermal stress. It was further found that the presence of surface impurities, particularly silicon oxide greatly pinches the dislocation propagation, which in turn inhibits the relaxation process. Thus, according to the present invention, the relaxation process is induced in-situ after the strained layer is grown without exposing the strained layer to an oxidizing ambient.

Once relaxed layer 12 has been formed, strained layer 14 is formed over relaxed layer 12 as represented in block 38. In one embodiment, substrate 11 is kept within the reactor chamber and the reactor chamber is heated to the appropriate temperature for forming strained layer 14. The appropriate source gases are then introduced and strained layer 14 is grown to the appropriate thickness. Typically, strained layer 14 is on the order of 100 angstroms to 800 angstroms thick. Once strained layer 14 is formed, substrate 11 is removed from the reactor chamber and then processed according to conventional techniques to provide SEMFET device 10 shown in FIG. 1.

In an alternative embodiment, at the step represented by block 33, a portion of the total thickness of the strained layer is grown. This portion is then relaxed according to block 36. A remaining portion is then grown and subsequently relaxed. Optionally, the above steps are repeated a number of times to provide relaxed layer 12.

In a further embodiment, substrate 11 is removed from the reactor chamber after the relaxation step. Relaxed layer 12 is then planarized using conventional techniques to smooth the surface of relaxed layer 12 or to decrease its overall thickness (e.g., for forming separation by implanted oxygen (SIMOX) silicon-on-insulator (SOI) structures). Strained layer 14 is then subsequently grown over relaxed layer 12 according to block 38. Optionally, strained layer 14 also is planarized after it is grown to remove any surface irregularities.

Figure 3:
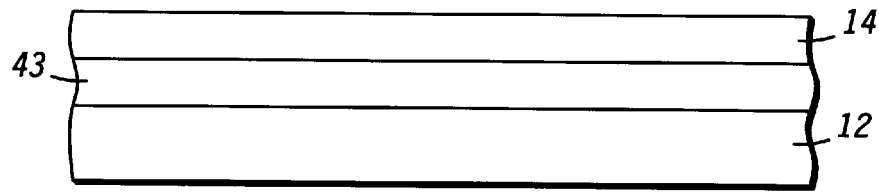
FIG. 3 illustrates an enlarged cross-sectional view of a preferred relaxed layer embodiment according to the present invention.

In a still further embodiment and as shown in FIG. 3, a thin buffer layer 43 is formed over relaxed layer 12 and comprises the same material as relaxed layer 12, but preferably is undoped. The thin buffer layer preferably has a thickness on the order of 125 angstroms to 175 angstroms and functions to further insure low levels of defects during the subsequent growth of strained layer 14. Optionally, an additional thin buffer layer (not shown) that comprises the same material as relaxed layer 12 (preferably undoped) is formed between substrate 11 and relaxed layer 12.

The authors carried out experimental work to determine the degree of lattice relaxation of a strained $Si_{1-x}Ge_x$ film according to one embodiment of the present invention. In a split process, $Si_{0.70}Ge_{0.30}$ films were deposited on bulk silicon and SIMOX SOI substrates at a temperature of about 700° C. The substrates were then cooled in-situ (i.e., without exposing the substrates to an oxidizing ambient) to a temperature on the order of room temperature (i.e., on the order of about 25° C. to about 35° C.). In one of the splits, the substrates where then heated to about 750° C. for less than about 5 seconds and in the other split, the substrates where heated to about 800° C. for less than about 5 seconds. Finally, a strained silicon capping layer was formed over the relaxed $Si_{0.70}Ge_{0.30}$ layers.

The degree of relaxation was determined using the reduction of film stress, where the percent relaxation is defined as the reduction of film stress divided by the original film stress multiplied by 100. When an as-grown film is fully strained, its original stress is determined by the Ge concentration in the film (the higher the Ge concentration, the higher the film stress). By this method, the percent relaxation for the $Si_{0.70}Ge_{0.30}$ layer on silicon was about 37% for the 750° C. split and about 57% for the 800° C. split. The percent relaxation for the $Si_{0.70}Ge_{0.30}$ layer on SIMOX SOI substrates was about 33% for the 750° C. split and about 62% for the 800° C. split.

The calculated mobility enhancement for the 62% relaxed substrates was determined to be approximately 3.0 times the mobility of a similarly doped unstrained silicon layer. This mobility enhancement value was verified using Hall mobility measurements, which showed a 360 $cm^2$/V-S value for an N+ strained silicon layer (0.00568 ohm-cm) compared to a 122 $cm^2$/V-S value for an N+ bulk silicon substrate (0.00354 ohm-cm).

The method according to the present invention is also suitable for forming low defect heteroepitaxial films having a large lattice mismatch (greater than about 3%) compared to the substrate the heteroepitaxial films are grown on. For example, the method according to the present invention is suitable for growing low defect heteroepitaxial films of SiC, GaAs, AlN, GaN, AlGaAs, AlGaN or the like on substrates such as silicon. Such a method is desirable because it allows, among other things, the growth of high performance materials having desired properties on larger diameter substrates. This results in substrates having diameters more compatible with existing and future processing equipment. By way of example only, the present invention will be described using the growth of SiC on a silicon substrate. As stated above, the present invention is equally suitable for growing other heteroepitaxial films.

SiC is considered a preferred material for electronic and optical devices exposed to high temperature and/or strong irradiation environments because of its large bandgap, temperature stability, and chemical inertness. However, it has been very difficult to epitaxially grow high quality SiC films on silicon substrates because of the large lattice mismatch between SiC and silicon (about 20% for cubic SiC on <100> silicon). One reported method for growing SiC on silicon involves two steps. First a carbonization buffer layer is grown on a silicon substrate using a hydrocarbon source gas at a temperature typically in range from 1000° C. to 1360° C.

Next, a SiC device layer or film (i.e., a film for forming active devices) is grown on the carbonization layer using silane and a hydrocarbon at a higher temperature (1200°–1400° C.). Although this approach may have been an improvement over previous attempts to grow SiC heteroepitaxial films, it still produces films with unacceptably high levels of defects. Such defects include voids that result from silicon atoms diffusing from the substrate into the carbonization layer, which react with carbon to form SiC.

The authors of the present invention found that another source of defects in the prior art process is gas phase nucleation. That is, silane easily forms solid nuclei or particles in the gas phase at the temperatures required to grow SiC. These particles then land on the substrate and introduce defects into the growing SiC device layer. Additionally, defects such as threading dislocations result from high film stress, which is caused by the significant lattice mismatch between SiC and silicon. This film stress increases as the thickness of the SiC device layer increases, which ultimately limits semiconductor device functionality.

Figure 4:
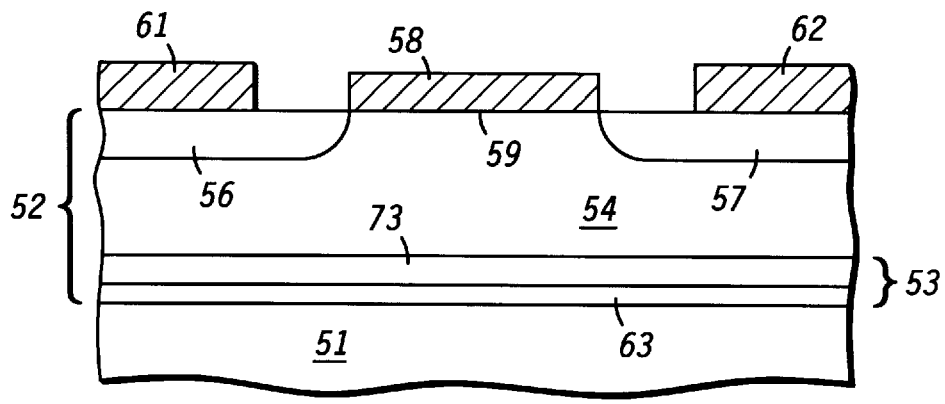
FIG. 4 illustrates an enlarged cross-section view of another semiconductor device fabricated according to the present invention.

FIG. 4 illustrates an enlarged cross-sectional view of a metal semiconductor field effect transistor (MESFET) device 50 manufactured according to the present invention. Device 50 includes a substrate 51, which in this example comprises silicon. Device 50 further includes heteroepitaxy layer 52 formed over substrate 51. Heteroepitaxy layer 52 includes one or more thermally induced relaxed layers 53 and a device layer 54, which is used for forming key elements of the active device. Together, substrate 51, relaxed heteroepitaxy layers 53 and device layer 54 form a semiconductor wafer. In this example, relaxed layers 53 and device layer 54 comprise SiC.

Active device regions such as source region 56 and drain region 57 are formed in device layer 54. A control electrode 58 is formed over upper surface 59 of device layer 54 and between source region 56 and drain region 57. A source electrode 61 is formed to contact source region 56, and a drain region 62 is formed to contact drain region 57. Source region 56, drain region 57, control electrode 58, source electrode 61 and drain electrode 62 are formed using well known processing techniques. MESFET device 50 is one of many device designs possible using the present invention.

Figure 5:
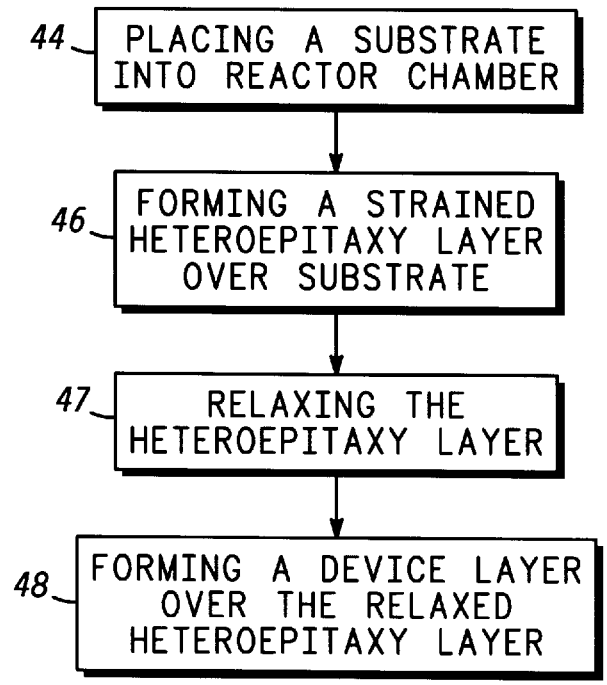
FIG. 5 illustrates a process flow according to another embodiment of the present invention.

FIG. 5 illustrates a process flow according to the present invention for forming heteroepitaxy layer 52 over substrate 51. Block 44 represents the step of placing substrate 51 into a reactor chamber or device. Suitable reactors for practicing this embodiment of the present invention include the Aixtron reactor available from Aixtron GmbH of Aachen, Germany and the Emcore reactor available from Emcore Corporation of Sommerset, N.J.

Once the chamber has been sealed, pressure within the chamber preferably is reduced to a range from about 1 torr to about 50 torr to evacuate air from the chamber. Alternatively, the chamber is purged with hydrogen at atmospheric pressure to remove nitrogen and oxygen from the chamber. Next substrate 51 is exposed to a hydrogen pre-bake at a temperature from about 1100° C. to about 1200° C. Alternatively, substrate 51 is etched in HCl with a hydrogen carrier gas in the same temperature range.

Next as illustrated in block 46, a layer 63 of SiC is grown over substrate 51. Chemical vapor deposition (CVD) is a preferred method for growing layer 63, but other methods such as molecular beam epitaxy or metal organic CVD (MOCVD) can be used as well. Preferably, the growth pressure in a range from about 100 torr to about 200 torr is used. Alternatively, atmospheric pressure is used. Since SiC has a smaller lattice parameter than silicon, as grown layer 63 is a strained layer. The thickness of layer 63 preferably is less than the critical thickness to prevent the onset of threading dislocation generation. The critical thickness of epitaxial SiC on (100) silicon is estimated to be in a range from about 40 Å to about 100 Å. By keeping layer 63 in this thickness range, the film is highly strained, but few threading dislocations and/or other defects are present.

Layer 63 is grown using, for example, silane and a carbon source gas such as propane at temperature in range from about 1200° C. to about 1410° C. The authors found that to minimize the gas phase nucleation problem mentioned above, the partial pressure of silane preferably is kept below approximately 0.005% in hydrogen or an inert gas such as helium. In prior art processes, the silane partial pressure it kept at a much higher percentage (0.026–0.03%). Preferably, a silicon to carbon ratio in the gas phase from about 0.35 to about 0.70 is used depending on the type of carbon source used. A lower ratio is used when saturated hydrocarbon such as propane is used, and a higher ratio is used when an unsaturated hydrocarbon such as acetylene is used.

Alternatively, dichlorosilane is used instead of silane with the partial pressure preferably kept below approximately 0.01% in hydrogen or an inert gas such as helium to minimize gas phase nucleation. Optionally, trichlorosilane is used with the partial pressure kept below approximately 0.015% in hydrogen or an inert gas such as helium to minimize gas phase nucleation. The above conditions are found to reduce the formation of silicon particles in the gas phase and reduce defects in the SiC film resulting from the silicon particles being embedded in the growing film.

Next as shown in block 47 and similar to block 36 of FIG. 2, layer 63 is thermally stressed without exposing substrate 51 and layer 63 to an oxidizing ambient to relax layer 63. Preferably, after layer 63 is grown, the reactor heating means are turned off, and substrate 51 and layer 63 are allowed to cool in the reactor chamber to a temperature below the growth temperature to create the thermal stress, which in turn provides lattice relaxation. In other words, small fractions of the interfacial SiC-silicon bonds that are highly strained because of the lattice mismatch at the interface between substrate 51 and layer 63, are broken and re-arranged to release the stress. Preferably, vacuum is maintained and/or hydrogen gas (or an inert gas) flow within the reactor chamber to provide a cooling rate from about 20°–80° C./second. In a preferred embodiment, substrate 51 is cooled to a temperature less than about 800° C.

During this step, some non-bonded atoms at the silicon/SiC interface form misfit dislocations. Since the misfit dislocations are confined to the interface, they are not detrimental defects. More significantly, the result of the film relaxation changes the epitaxial SiC in-plane lattice parameter from conforming to the silicon lattice parameter to restoring its own value. The restoration of the lattice parameter of layer 63 to its own value provides an improved substrate for forming subsequent SiC layers compared to substrate 51.

Next, the reactor heating means are turned back on and substrate 51 is rapidly heated at a rate of about 20°–80° C./second to induce another thermal stress. Blocks 46 and 47 are repeated to form heteroepitaxy layer 73 over layer 63. Preferably, the thickness of layer 73 is the same or thicker than layer 63 since the lattice mismatch between layers 73 and layer 63 is smaller than between layer 63 and substrate 51. Alternatively, the thickness of layer 73 is less than thickness of layer 63 and can still be relaxed by thermal stress. It is estimated that approximately 15% to approximately 33% lattice relaxation occurs with each relaxation step represented by block 47.

To approach maximum lattice relaxation, it is preferred that steps 46 and 47 be repeated approximately 3 to 8 times to form relaxed layers 53 before growing device layer 54. The thickness of each subsequent layer within layers 53 preferably is within a range from about 60 Å and 1000 Å with the thickness preferably increasing with each subsequent layer. By repeating steps 46 and 47 to provide several thermally relaxed layers, the lattice parameter (in-plane) of the top layer in layers 53 approaches or is similar to the lattice parameter of bulk SiC. This results in device layer 54 having a low defect density compared to prior art processes. Additionally, this method eliminates the void formation problem associated with carbonization layers.

Once the desired amount of lattice relaxation is obtained, the reactor chamber is heated to the appropriate growth temperature to form device layer 54 as represented by block 48. The thickness of layer 54 depends on the particular device application. As stated above, because device layer 54 is formed over relaxed layers 53, device layer 54 is similar to a homoepitaxy layer, and thus it is not necessary to thermally stress device layer 54.

In an optional embodiment, a carbonization layer (i.e., a thin layer of carbon) is deposited at a temperature between about 1200° C. to about 1400° C. on substrate 51 and relaxed as described in block 47 of FIG. 5 before layer 63 is grown. The carbonization layer preferably has a thickness of about 50–100 Å to reduce void formation. Once the carbonization layer is formed, one or more SiC layers are grown and relaxed according to blocks 46 and 47 of FIG. 5. When the desired amount of lattice relaxation occurs, device layer 54 is then grown over the relaxed layers.

By now it should be appreciated that methods have been provided for forming a relaxed layer for use in heterojunction device formation. The methods according to the present invention avoid the use of thick epitaxial layers, which saves on processing time and cost. Also, the formation of threading dislocations is reduced. Additionally, the use of thin buried oxide, helium implants, hydrogen implants, and low melting point glasses are avoided thereby reducing defect formation and Ge inter-diffusion, and saving on processing costs. Moreover, the method according to the present invention provides a way to form high quality heteroepitaxial films over larger diameter support substrates that is cost effective and reliable.

What is claimed is:

1. A method for forming a heterojunction semiconductor device comprising the steps of:
    placing a substrate comprising a first material having a first lattice constant into a reactor chamber;
    forming a first layer over the substrate, wherein the first layer comprises a second material having a second lattice constant different than the first lattice constant such that the first layer forms a strained layer; and
    relaxing the strained layer while the substrate is within the reactor chamber before exposing the substrate to an oxidizing ambient to form a relaxed layer.

2. The method of claim 1 wherein the first layer comprises $Si_{1-x}Ge_x$.

3. The method of claim 2 wherein x is in a range from about 0.10 to about 0.50.

4. The method of claim 3 wherein x is in a range from about 0.25 to about 0.35.

5. The method of claim 1 wherein step of forming the first layer includes forming the first layer at a first temperature and wherein the step of relaxing the strained layer includes cooling the substrate to a second temperature less than the first temperature.

6. The method of claim 5 wherein the step of forming the first layer includes forming the first layer wherein the first temperature is between approximately 500° C. and approximately 800° C.

7. The method of claim 5 wherein the step of relaxing the strained layer includes cooling the substrate to less than or equal to approximately 100° C.

8. The method of claim 5 further comprising the step of heating the substrate to a third temperature greater than the first temperature after the step of cooling the substrate to the second temperature.

9. The method of claim 1 further comprising the step of forming a third layer on the relaxed layer, wherein the third layer comprises a third material having a third lattice constant different than the second lattice constant such that the third layer is strained.

10. The method of claim 9 further comprising the step of planarizing the third layer.

11. The method of claim 9 wherein the step of forming the third layer includes forming the third layer before exposing the substrate to an oxidizing ambient.

12. The method of claim 1 further comprising the step of planarizing the relaxed layer.

13. The method of claim 1 further comprising the steps of:
forming a third layer on the relaxed layer, wherein the third layer comprises the second material;
relaxing the third layer; and
forming a fourth layer on third layer, wherein the fourth layer comprises a fourth material having a fourth lattice constant different than the second lattice constant such that the fourth layer is strained.

14. The method of claim 1 wherein the step of forming the first layer includes forming the first layer comprising SiC.

15. The method of claim 1 further comprising the steps of:
forming a second layer over the first layer, wherein the second layer has a third lattice constant different than the first lattice constant; and
relaxing the second layer while the substrate is within the reactor chamber before exposing the substrate to an oxidizing ambient to form a second relaxed layer.

16. The method of claim 1 further comprising the step of forming a device layer over the first layer, wherein the device layer has a third lattice constant different than the first lattice constant.

17. A process for forming a semiconductor device comprising the steps of:
providing a substrate;
forming a first strained layer over the substrate;
relaxing the first strained layer without exposing the first strained layer to an oxidizing ambient to form a relaxed layer;
forming a second strained layer over the relaxed layer;
forming a gate control structure over the second strained layer; and
forming a source region and a drain region in the second strained layer.

18. The process of claim 17 wherein the step of forming the first strained layer includes forming a layer comprising $Si_{1-x}Ge_x$ and wherein the step of forming the second strained layer includes forming a layer comprising silicon.

19. The process of claim 17 wherein the step of relaxing the first strained layer includes thermally stressing the first strained layer.

20. The process of claim 19 wherein the step of relaxing the first strained layer includes the steps of:
cooling the substrate to a first temperature below that temperature at which the first strained layer was formed; and
heating the substrate to a second temperature above that at which the first strained layer was formed.

21. A method for forming a semiconductor device comprising the steps of:
providing a substrate comprising a first material having a first lattice constant, the substrate further including a relaxed layer comprising a second material having a second lattice constant different than the first lattice constant, and a first layer comprising a third material having a third lattice constant different than the second lattice constant formed over the relaxed layer, wherein the relaxed layer is formed by forming a strained layer over the substrate and relaxing the strained layer by thermal stress without exposing the strained layer to an oxidizing ambient;
forming a gate control structure over the first layer; and
forming a source and a drain region in the first layer.

22. The method of claim 21 wherein the step of providing the substrate includes providing the substrate wherein the relaxed layer comprises $Si_{1-x}Ge_x$.

23. The method of claim 21 wherein the step of providing the substrate includes providing the substrate wherein the step of relaxing includes cooling the substrate to a first temperature below that temperature at which the strained layer was formed and then heating the substrate to a second temperature greater than the temperature at which the strained layer was formed.

24. A method for forming a semiconductor device comprising the steps of:
providing a semiconductor substrate having a first lattice parameter;
forming a first heteroepitaxial film having a second lattice parameter different than the first lattice parameter over the semiconductor substrate within a reactor chamber; and
thermally stressing the first heteroepitaxial film without exposing the first heteroepitaxial film to an oxidizing ambient to provide a first relaxed film.

25. The method of claim 24 wherein the step of providing the semiconductor substrate includes providing a silicon substrate.

26. The method of claim 24 wherein the step of forming the first heteroepitaxial film includes forming the first heteroepitaxial film comprising one of SiC, GaAs, AlN, GaN, AlGaAs, and AlGaN.

27. The method of claim 24 further comprising the steps of:
forming a second heteroepitaxial film over the first relaxed film, wherein the second heteroepitaxial film has a third lattice parameter different from the first lattice parameter;
thermally stressing the second heteroepitaxial film without exposing the second heteroepitaxial film to an oxidizing ambient to provide a second relaxed film;
forming a device layer over the second relaxed film; and
forming an active device in the device layer.

28. The method of claim 27 wherein the step of forming the active device includes forming a MESFET device.

29. The method of claim 24 wherein the step of forming the first heteroepitaxial film includes forming the first heteroepitaxial film at a first temperature and wherein the step of thermally stressing the first heteroepitaxial film includes one of cooling the semiconductor substrate and heating the semiconductor substrate to a second temperature different than the first temperature.

30. The method of claim 29 wherein the step of thermally stressing the semiconductor substrate includes the steps of:

cooling the substrate to less than or equal to approximately 800° C.; and heating the substrate back to at least the first temperature.

31. The method of claim 24 wherein the step of forming the first heteroepitaxial film include forming a SiC film using a silane source gas, wherein partial pressure of the silane source gas is kept below approximately 0.005% in one of hydrogen and an inert gas.

32. The method of claim 24 wherein the step of forming the first heteroepitaxial film includes forming a SiC film using a dichlorosilane source gas, wherein partial pressure of the dichlorosilane source gas is kept below approximately 0.01% in one of hydrogen and an inert gas.

33. The method of claim 24 wherein the step of forming the first heteroepitaxial film includes forming a SiC film using a trichlorosilane source gas, wherein partial pressure of the trichlorosilane source gas is kept below approximately 0.015% in one of hydrogen and an inert gas.

34. The method of claim 24 wherein the step of forming the first heteroepitaxial film includes forming a SiC film using a silicon source gas and a carbon source gas, wherein a gas phase silicon to carbon ratio from about 0.35 to about 0.7 is used while forming the SiC film.

35. A method for forming a semiconductor device including a relaxed heteroepitaxy layer comprising the steps of:

providing a semiconductor wafer including a substrate, a first relaxed heteroepitaxy layer formed over the substrate and a device layer formed over the first relaxed heteroepitaxy layer, wherein the substrate and the device layer have different lattice constants, and wherein the first relaxed heteroepitaxy layer is formed by forming a first strained heteroepitaxy layer over the substrate and relaxing the first strained heteroepitaxy layer by thermal stress without exposing the first strained heteroepitaxy layer to an oxidizing ambient;

forming active device regions in the device layer; and forming contacts to the active device regions.

36. The method of claim 35 wherein the step of forming active device regions includes forming a source region and drain region.

37. The method of claim 35 wherein the step of providing the semiconductor wafer includes providing the semiconductor wafer having a second relaxed heteroepitaxy layer formed between the first relaxed heteroepitaxy layer and the device layer.

38. The method of claim 35 wherein the step of providing the semiconductor wafer includes providing the semiconductor wafer having a silicon substrate, a SiC first relaxed heteroepitaxy layer, and a SiC device layer.

* * * * *